United States Patent [19]
Ouchi et al.

[11] Patent Number: 5,821,626
[45] Date of Patent: Oct. 13, 1998

[54] FILM CARRIER, SEMICONDUCTOR DEVICE USING SAME AND METHOD FOR MOUNTING SEMICONDUCTOR ELEMENT

[75] Inventors: Kazuo Ouchi; Shoji Morita; Atsushi Hino; Masakazu Sugimoto, all of Ibaraki, Japan

[73] Assignee: Nitto Denko Corporation, Osaka, Japan

[21] Appl. No.: 669,904

[22] Filed: Jun. 25, 1996

[30] Foreign Application Priority Data

Jun. 30, 1995 [JP] Japan .................................. 7-165792

[51] Int. Cl.⁶ ...................................................... H01L 23/48
[52] U.S. Cl. ............................................ 257/778; 257/779
[58] Field of Search ............................ 257/48, 778, 779, 257/702

[56] References Cited

U.S. PATENT DOCUMENTS 5,475,236  12/1995  Yoshizaki .................................. 257/48

*Primary Examiner*—Tom Thomas
*Assistant Examiner*—Roy Potter
*Attorney, Agent, or Firm*—Sughrue, Mion, Zinn, Macpeak & Seas, PLLC

[57] ABSTRACT

A film carrier comprising, on a laminate of an insulating layer and a conductive circuit, a conductive part to be connected to an external[000c]substrate and an energy introduction part to supply an energy to connect a semiconductor element, a semiconductor device, and a method for mounting a semiconductor element. The present invention has enabled provision of fine-pitched or highly dense wiring of a semiconductor element, and assures easy and dependable electric construction of the present invention wherein an energy for connection is supplied from the energy introduction part to make a connection of a film carrier to semiconductor element is advantageous in that attenuation of the energy for connection due to an insulating layer occurs less, since the energy for connection can be directly introduced into conductive circuit, thus enabling efficient utilization of the energy, which in turn permits easy and efficient mounting of a semiconductor element.

15 Claims, 7 Drawing Sheets

FILM CARRIER, SEMICONDUCTOR DEVICE USING SAME AND METHOD FOR MOUNTING SEMICONDUCTOR ELEMENT

FIELD OF THE INVENTION

The present invention relates to a film carrier used for mounting a semiconductor element, a semiconductor device comprising a semiconductor element mounted on said film carrier, and a method for mounting a semiconductor element on said film carrier.

BACKGROUND OF THE INVENTION

A semiconductor element has been conventionally mounted by a film carrier method. According to this film carrier method, a lead on a film carrier and an electrode of a semiconductor element are connected via a conductive protrusion (hereinafter to be referred to as a bump) for connection, with the aid of which the semiconductor element is mounted.

In said film carrier method, a bump is conventionally formed on an electrode surface of a semiconductor element using gold, etc. In so doing, an adhesive metal layer of, for example, copper, platinum and palladium for prevention of the diffusion of bump metals need to be formed on the electrode surface before forming a bump. As a result, the fabrication becomes extremely complicated. In addition, the semiconductor element and the electrode surface may be contaminated or damaged while forming a bump on the electrode surface of the semiconductor element.

To avoid such problems, it is suggested to form a bump not on the electrode surface of a semiconductor element, but on the side of the lead on a film carrier. In this method, however, it may be difficult to form corresponding circuits or bumps on the film carrier when the wiring of the semiconductor element becomes fine-pitched or highly dense.

It is suggested, therefore, to use, instead of the aforementioned bumps, an anisotropic conductive film having a conductivity in the direction of the thickness of the film. Such anisotropic conductive film contains conductive particles such as carbon black and metal particles oriented in the particles such as carbon black and metal insulating film and dispersed therein. However, this anisotropic conductive film is associated with difficulties in that insufficient orientation of the conductive particles leads to an uncertain electrical connection between the lead on the film carrier and the electrode of the semiconductor element, which in turn causes poor connection reliability and greater electric resistance at the connected part.

It is therefore an object of the present invention is to overcome problems found in the conventional film carrier method and to provide a film carrier permitting a fine-pitched or highly dense wiring of a semiconductor element and capable of easy, positive and efficient electrical connection to the electrode of a semiconductor element.

A semiconductor element mounted on a film carrier is often protected by sealing same with an insulating resin. When the film carrier has an exposed conductive circuit, however, an insulating sealant resin directly contacts said conductive circuit. The metal constituting the conductive circuit and the insulating resin adhere poorly to each other, allowing water in the air and other substances to intrude into the interface of the two to possibly degrade the reliability of the semiconductor device obtained.

It is then suggested to cover the entire surface of the conductive circuit with an insulating layer to prevent exposure of the conductive circuit (Japanese Patent Unexamined Publication No. 77293/1994). According to this construction, the conductive circuit is protected with the insulating layer, so that the above-mentioned intrusion of water etc. is prevented.

Another object of the present invention is to provide a semiconductor device which has been miniaturized in line with the fine-pitched or highly dense wiring of semiconductor elements, which is capable of ensuring the electric connection between the electrode of a semiconductor element and a film carrier, and which permits easy and efficient fabrication.

A still another object of the present invention is to provide a method for mounting a semiconductor element, which permits a fine-pitched or highly dense wiring of a semiconductor element, and which is capable of ensuring, with ease, the electric connection between the electrode of a semiconductor element and a film carrier.

SUMMARY OF THE INVENTION

The film carrier of the present invention comprises, on a laminate of an insulating layer and a conductive circuit, a conductive part to be connected to an external substrate and an energy introduction part to supply energy for connecting a semiconductor element.

The semiconductor device of the present invention comprises a semiconductor element mounted on the film carrier of the present invention.

The method of the present invention for mounting a semiconductor element on the film carrier comprises brining the electrode of a semiconductor element into contact with the conductive circuit of the film carrier of the present invention, which may be a conductive part for connecting a semiconductor element in some embodiments, and applying an energy from an energy introduction part to this contact part to electrically connect the conductive circuit to a semiconductor element or the conductive part to the electrode of the semiconductor element.

In the present invention, a "semiconductor device" means an assembly of semiconductor elements such as a silicon chip after dicing, a circuit substrate for mounting on a semiconductor device, a circuit substrate for LCD, a fine-pitched circuit substrate such as hybrid IC, and MCM substrate, and a "conductive circuit" denotes a wide concept inclusive of not only wiring patterns, but also electrode, lead and the like.

The "energy for connecting semiconductor element" means an energy such as heat, pressure ultrasonic wave, and two or more therefrom in combination, which are conventionally applied to connect the lead on a film carrier to the electrode of a semiconductor element.

A film carrier and a semiconductor element may be connected by forming an energy introduction part on the film carrier, which introduces energy for connection into the intended part. This construction is advantageous in that the energy for the connection can be directly applied to the connection between the film carrier and the semiconductor element, and the energy can be efficiently utilized with less occurrence of diffusion of the energy due to an insulating layer.

DETAILED DESCRIPTION OF THE INVENTION

The film carrier of the present invention is explained in more detail by illustrating the figures.

Figure 1:
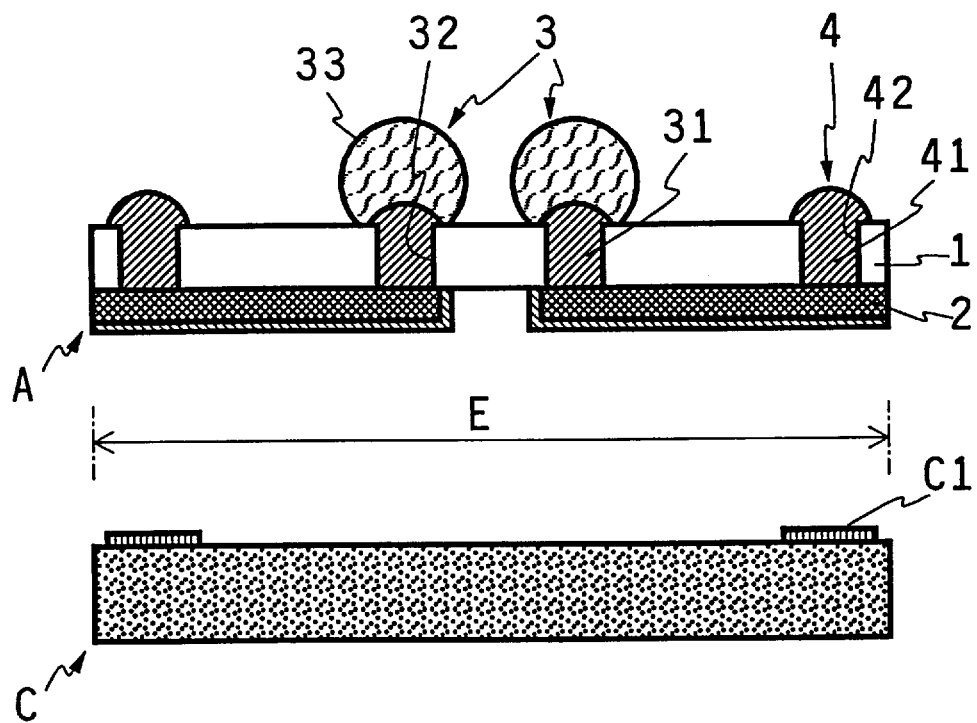
FIG. 1 is a schematic cross section of one embodiment of the film carrier of the present invention.

FIG. 1 is a schematic cross section of the one embodiment of the film carrier of the present invention. In this figure, A is a film carrier having a conductive circuit 2 laminated on an insulating layer 1. Said laminate has a conductive part 3 (conductive path 31) for connecting an external substrate (not shown), and an energy introduction part 4 (conductive path 41) for introducing an energy for connecting a semiconductor element C.

The material of the insulating layer is subject to no particular limitation as long as it can stably support a conductive circuit, conductive path and the like, and substantially has electrical insulating property. Specific examples include various thermosetting resins and thermoplastic resins such as polyester resin, epoxy resin, urethane resin, polystyrene resin, polyamide resin (ABS resin), polycarbonate resin, silicone resin and fluororesin, with preference given to polyimide resin in view of the superior heat resistance, dimensional stability on heating and mechanical strength.

While the thickness of the insulating layer is not particularly limited, it is about 2–500 $\mu$m, preferably about 5–150 $\mu$m, to achieve sufficient mechanical strength and flexibility.

The material of the conductive circuit is subject to no particular limitation as long as it has conductivity, and is exemplified by various metals (e.g., gold, silver, copper, nickel and cobalt) and various alloys containing them as main components.

While the thickness of the conductive circuit is not particularly limited, it is generally about 1–200 $\mu$m, preferably about 5–80 $\mu$m.

The laminate of an insulating layer and a conductive circuit can be obtained by, for example, forming a conductive layer on an insulating layer and processing the conductive layer to form a desired circuit pattern (subtractive method).

In the subtractive method, a conductive layer is formed on an insulating layer by, for example, coating the insulating layer with a conductive paint containing a metal powder of the above-mentioned various metals or alloys or conductive particles such as carbon black, and a binder such as polyester, or a conductive membrane of the above-mentioned metals is formed on an insulating layer by sputtering, CVD, vacuum evaporation deposition and the like and the membrane is grown to the desired thickness by plating and the like. It is also possible to use, as a conductive layer, a foil of the above-mentioned metals and form an insulating layer on the foil by applying the above-mentioned various resins or a precursor solution thereof, followed by removal of the solvent, or to adhere a film of the above-mentioned various resins.

The laminate of an insulating layer and a conductive circuit can be also manufactured by directly processing a conductive material into a circuit pattern without forming a conductive layer (e.g., additive method and semi-additive method).

The above-mentioned conductive circuit is preferably coated with a metal having high connection reliability, such as gold, to ensure connection to the electrode of a semiconductor element. In this case, a layer of a barrier metal such as nickel is desirably interposed between said metal coating and the conductive circuit, depending on the kind of the metals used. The method for forming the aforementioned metal coating and barrier metal layer includes, for example, plating method such as electrolytic plating and electroless plating, sputtering, ion plating and vacuum evaporation deposition.

The energy introduction part need only accept the energy for connection from outside and transmit same to the desired contact parts in the conductive circuit to connect the electrode of the semiconductor element. In the embodiment shown in FIG. 1, the energy introduction part 4 has a conductive path 41.

The material for said conductive parts 3 and 4 is subject to no particular limitation as long as it has conductivity, and may be known metallic materials, such as gold, silver, copper, platinum, zinc, tin, nickel, cobalt, indium, rhodium, chromium, tungsten and ruthenium, and various alloys containing same as components (e.g., solder, nickel-tin alloy and gold-cobalt alloy). Alternatively, a conductive paste containing dispersed conductive particles such as metallic powder and carbon black as mentioned above may be used.

The conductive parts 3 and 4 are protruded form the surface of the insulating layer 1 in FIG. 1. Accordingly, positioning upon contact with (or connection to) the mating connection parts, such as an energy supply means (not shown) and the electrode of external substrate, is facilitated, and can be performed with certainty. The height of the protrusion form the surface of the insulating layer 1 is not particularly limited, but it is suitably about 5–200 $\mu$m to secure contact with (or connection to) the mating connection parts and to improve reliability after connection.

The shape of the protrusion of the conductive parts 3 and 4 may be like mushroom (umbrella) as shown in FIG. 1, semi-sphere, prism, column, sphere, cone (e.g., circular cone and pyramid) or truncated shape. The bottom shape of the protrusion may be triangle quadrilateral (e.g., square, rectangle, parallelogram and trapezoid), other polygon, circle or ellipse.

The conductive parts 3 and 4 can be formed by, for example, forming through-holes 32 and 42 in the insulating layer 1, thereby exposing a conductive circuit 2 at the bottom of said through-holes 32 and 42, and filling the through-holes 32 and 42 with a conductive substance.

A through-hole can be formed by, for example, mechanical processing such as punching, photolithographic processing, plasma processing, chemical etching processing and laser processing, with preference given to laser processing capable of elaborate processing required for fine-pitched products. In particular, the use of an ultraviolet laser having an oscillation wavelength in the ultraviolet range is preferably.

The diameter of the through-hole is about 5–500 μm. Specifically, the through-hole 42 forming the conductive path 41 preferably has as diameter of about 10–100 μm, and the through-hole 32 forming the conductive path 31 preferably has a diameter of about 10–300 μm.

The method for filling a conductive substance in the above-mentioned through-holes is not limited to a physical filing method comprising injecting a conductive substance into a through-hole with pressure. In addition to this method, plating method such as electrolytic plating and electroless plating, CVD or chemical filling may be used, which comprises immersing a portion where a through-hole is desired, into a melt bath to allow precipitation of a conductive substance. In particular, an electrolytic plating using a conductive circuit 2 as an electrode facilitates filling of a conductive substance.

Figure 2:
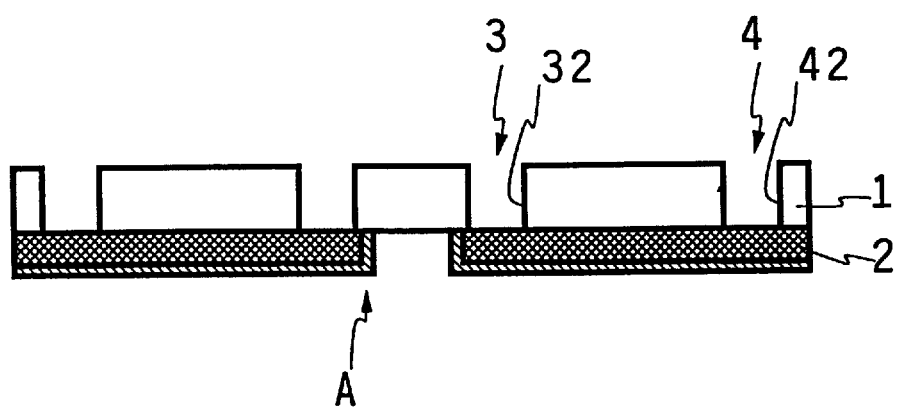
FIG. 2 is a schematic cross section of another embodiment of the film carrier of the present invention.

In the present invention, it is also possible to expose a conductive circuit 2 without filling a conductive substance in the above-mentioned through-hole 42, and to use the exposed conductive circuit as an energy introduction part 4, as shown in FIG. 2. In this case, the exposed conductive circuit is desirably plated with a metal which ensures contact with an energy supply means, such as gold, silver, copper and solder. The through-hole 32 may be filled with a conductive substance (e.g., solder and conductive paste) immediately before connection to an external substrate. Such mode of embodiment which eliminates filling of a conductive substance in a through-hole in the configuration of a film carrier simplifies the structure of the film carrier and decreases the production costs. Where necessary, either the above-mentioned through-hole 32 or 42 along may be filled with a conductive substance.

The conductive part 3 to be connected to an external substrate is formed inside the region E of the laminate of insulating layer 1 and conductive circuit 2, which region being designed to mount semiconductor element C in FIG. 1. According to this embodiment, the size (area) of the semiconductor device can be decreased to, for example, the size of the semiconductor element C, and electrode C1 of the semiconductor element C and a lead of the external substrate can be connected in a short distance, whereby a semiconductor device having superior electric properties can be obtained. The conductive part 3 may be formed outside the resin E where the semiconductor element C is to be mounted, or at a position bridging both inside and outside said region E. In other words, since the position of the conductive part 3 can be determined optionally, the position of the connection to an external substrate can be unified even when the position of the electrode C1 varies among individual semiconductor elements C, which is desirable for standardizing electronic parts.

A conductor 33 to be connected to an external substrate is preferably formed on said conductive path 31, as shown in FIG. 1. The material of the conductor 33 may be or may not be the same with the material of the conductive path 31. In general, the same material is used, and when the same material is used, the conductor 33 and the conductive path 31 are preferably formed integrally.

Figure 3:
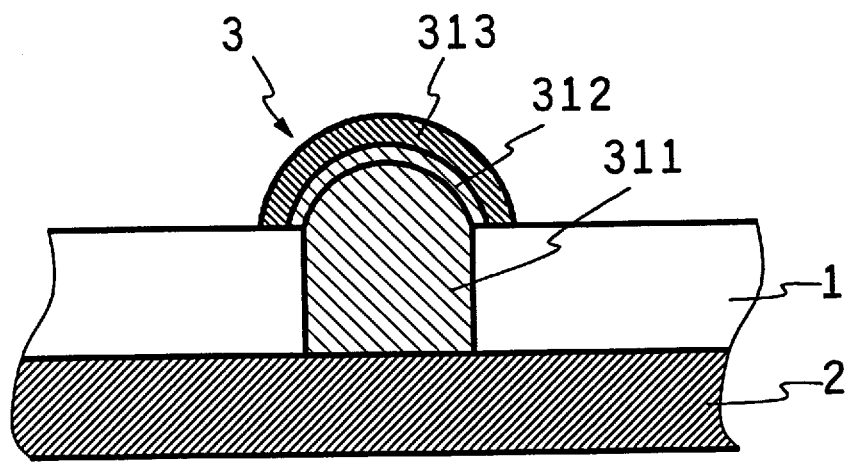
FIG. 3 is a schematic view of one embodiment of the conductive part of the film carrier of the present invention, which is constituted by plural kinds of materials.

The conductive part 3 and energy introduction part 4 may be made from two or more kinds of materials. FIG. 3 is a schematic view of one embodiment of the conductive part 3 (conductive path 311) which is constituted by plural kinds of materials. The conductive part 3 in this figure contains an economical metal such as copper for the part 311 in contact with a conductive circuit 2, and a metal highly reliable in connection performance, such as gold, is used for the part 313 to be connected to an external substrate. A barrier metal such as nickel which can prevent interaction between the above-mentioned two kinds of metals is used for the intermediate part 312 in between the above-mentioned two parts 311 and 313.

Figure 4:
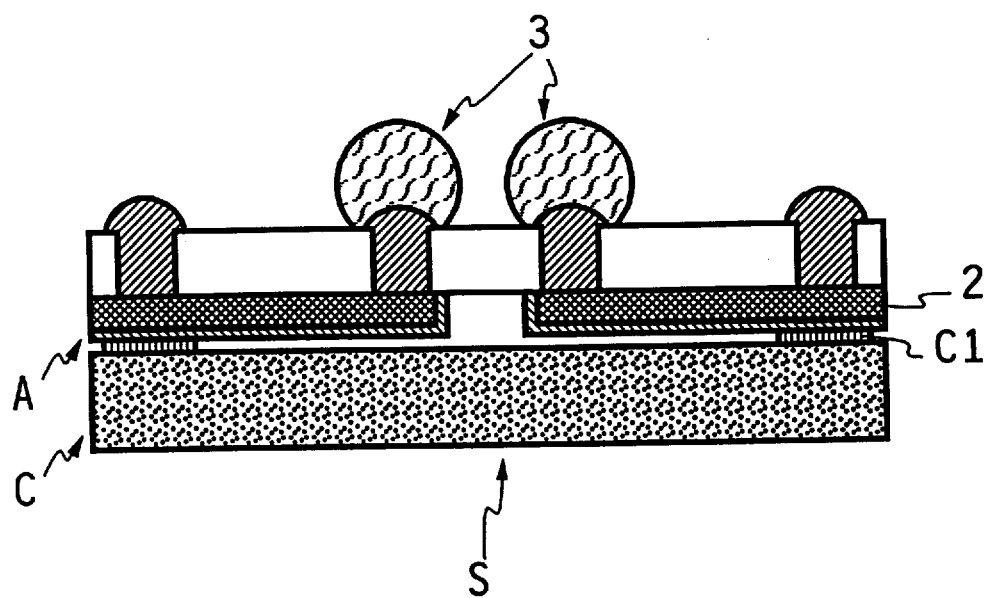
FIG. 4 is a schematic cross section of one embodiment of the semiconductor device of the present invention.

FIG. 4 is a schematic cross section of one embodiment of the semiconductor device of the present invention. In this figure, electrode C1 of semiconductor element C is connected to conductive circuit 2 of the film carrier A of the present invention, which is the same as the one shown in FIG. 1, to mount the semiconductor element C on said film carrier A.

In the semiconductor device S shown in FIG. 4, a conductive part 3 to be connected to an external substrate is formed inside the region where the semiconductor element C is mounted. Therefore, the size (area) of the semiconductor device S is about the same as the size (area) of the semiconductor element C.

Figure 5:
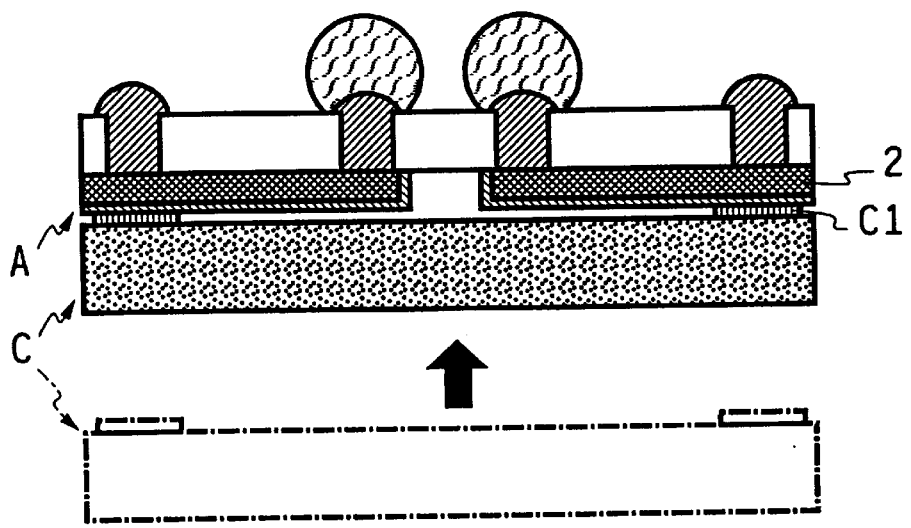
FIG. 5 is a schematic cross section of one embodiment of the method of the present invention for mounting a semiconductor element.
Figure 5:
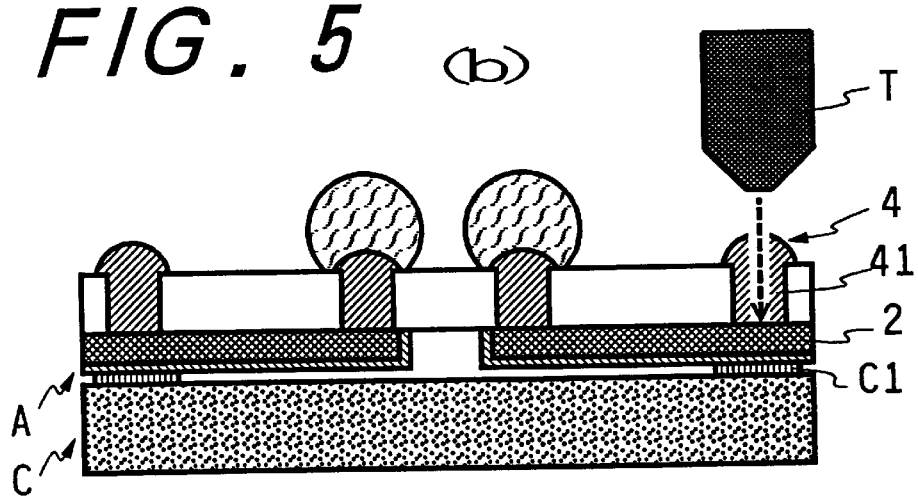
Figure 5:
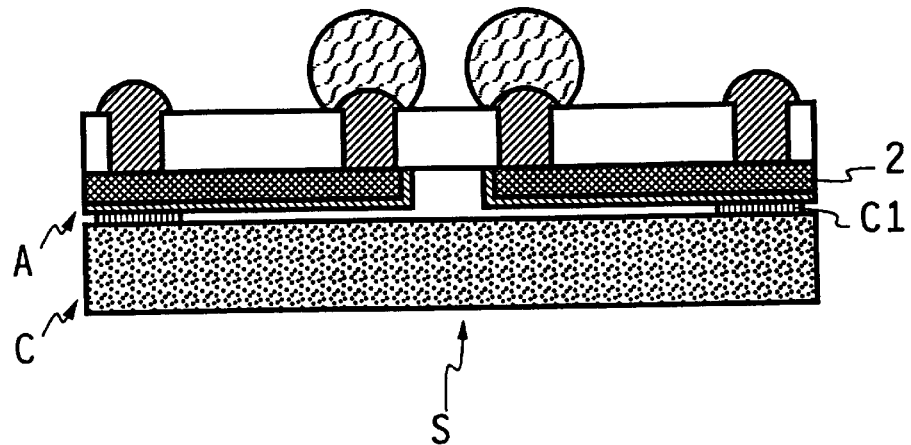

FIG. 5 includes schematic cross sections showing one embodiment of the present invention for mounting a semiconductor element. In this figure, as shown in FIG. 5(a), electrode C1 of semiconductor element C is brought into contact with the conductive circuit 2 of the film carrier A of the present invention, which is the same as the one shown in FIG. 1, and an energy is applied to said contact part via energy introduction part 4 in the film carrier A, as shown in FIG. 5(b), to connect said conductive circuit 2 to electrode C1, whereby a semiconductor device S which is the same as the one shown in FIG. 4 is obtained, as shown in FIG. 5(c).

The contact between the conductive circuit 2 and electrode C1 of semiconductor element C is accomplished by brining the energy supply means T into contact with the energy introduction part 4 (conductive path 41 in FIG. 5), as shown in FIG. 5(b), and supplying the energy for the connection of the conductive circuit 2 to electrode C1 from the energy supply means T. The energy for said connection is exemplified by heat, ultrasonic wave, pressure and a combination of these, which is determined as appropriate according to the materials constituting the semiconductor element C and film carrier A.

When the film carrier A is similar to that shown in FIG. 2, the example, an energy supply means T is brought into contact with the exposed part of the conductive circuit 2 at the bottom of through-hole 42 to supply an energy for the connection of the conductive circuit 2 with electrode C1.

Another mode of embodying the film carrier of the present invention is explained in the following.

Figure 6:
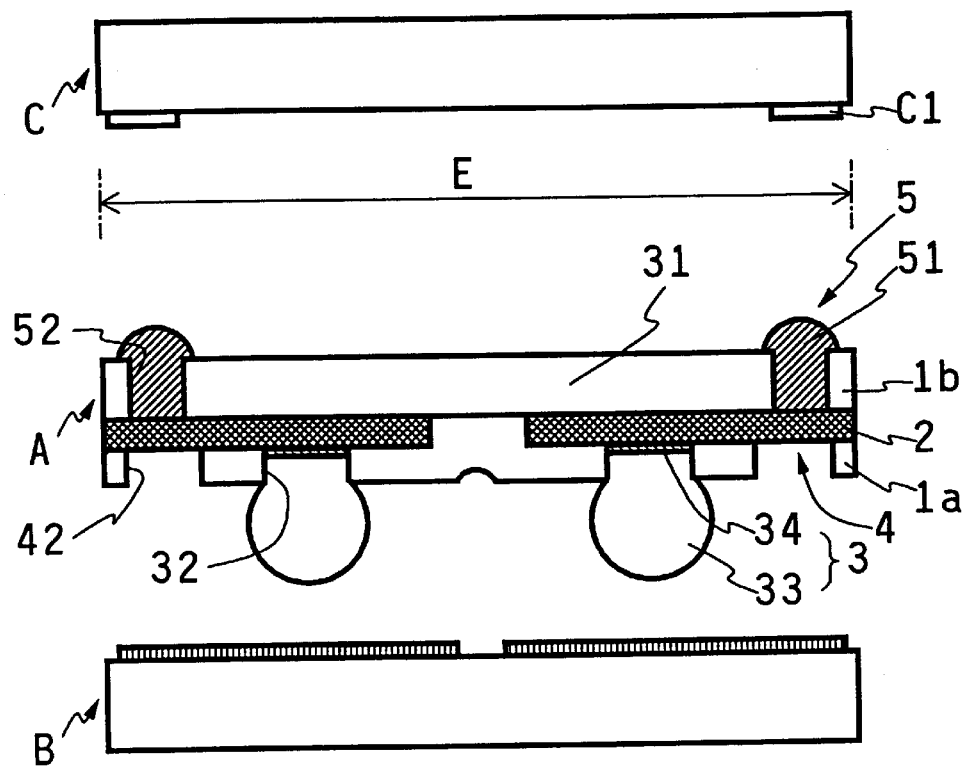
FIG. 6 is a schematic cross section of another embodiment of the film carrier of the present invention.

FIG. 6 is a schematic cross section of one embodiment of the film carrier of the present invention, wherein A is a film carrier comprising insulating layer 1a and 1b laminated on the both sides of the conductive circuit 2. This laminate contains a conductive part 3 to be connected to an external substrate B and a conductive part 5 to be connected to a semiconductor element C, and the insulating layer 1a is partially removed on the opposite side form the conductive part 5 to expose part of the conductive circuit.

The conductive circuit is mostly covered with an insulating layer on both sides and is not exposed. The insulating layers 1a and 1b have through-holes 32 and 52, respectively, which reach the surface of the conductive circuit. In the through-hole 32, a conductive layer 34 is formed for improving connection to the conductive circuit and a ball 33 to be connected to an external substrate, thereby constituting the conductive part 3 to be connected to the external substrate B. The through-hole 52 and a conductive path 51 forming the conductive part 5 to be connected to the semiconductor element C.

The insulating layer 1a preferably has a thickness of about 7–20 μm so that it will not pose problems for the insertion of a jig (hereinafter to be referred to as energy supply jig) used for the application of energy to connect the semiconductor element.

The materials of the insulating layers 1a and 1b are as exemplified above wherein the materials may be the same or different.

The conductive circuit is basically covered with insulating layers 1a and 1b and is not exposed. Therefore, the pattern of the conductive circuit can be freely designed irrespective of the pattern of the semiconductor element. The conductive circuit may be formed in a multi-layer structure of two or more layers. Such construction enables three-dimensional design of the conductive circuit to allow fine-pitched or highly dense mounting.

Figure 7:
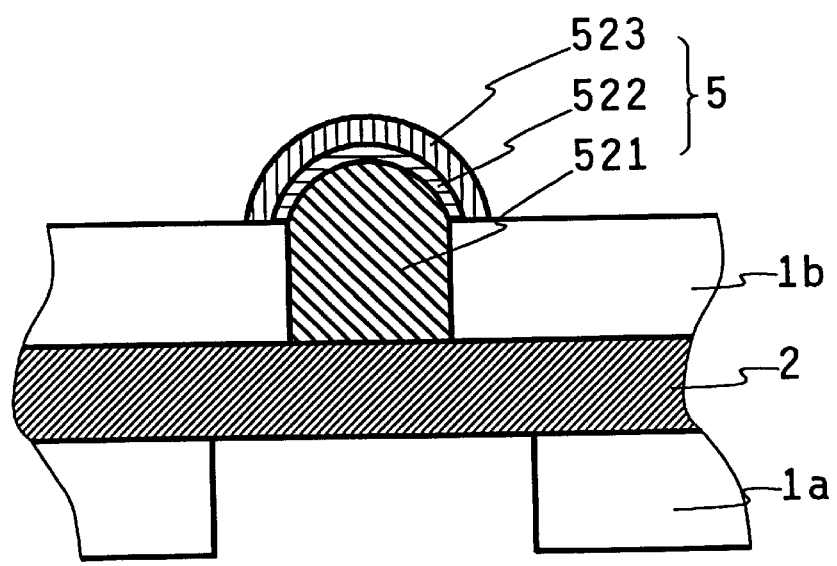
FIG. 7 is a schematic view of one embodiment of the conductive part of the film carrier of the present invention, which is constituted by plural kinds of materials.

The conductive part to be connected to the semiconductor element may be formed from a single kind of material or from two or more kinds of materials. FIG. 7 is a schematic view of one embodiment of the conductive part constituted by plural kinds of materials. In this figure, a cheap metal such as copper is used for the part 521 in contact with the conductive circuit 2, a metal highly reliable in connection performance, such as gold, is used for the part 523 to be connected to electrode C1 of semiconductor element C, and a barrier metal such as nickel which can prevent an interaction between the above-mentioned two kinds of metals is used for the intermediate part 522 in between the above-mentioned two parts 521 and 523. The conductive part 5 may be formed from four or more kinds of materials.

The conductive part 5 is protruded from the surface of the insulating layer 1b in FIG. 6. Therefore, positioning for the connection with the electrode C1 of the semiconductor element C is facilitated and the connection is ensured. While the height of the protrusion form the surface of the insulating layer 1b is not particularly limited, in view of an ensured connection to the electrode, it suitably about 0.1–50 μm.

The end portion of the conductive part 5 can be optionally modified in shape according to the layout and shape of the electrode of the semiconductor element. For example, when the electrode is planar, the end portion of the conductive part 5 is preferably made to have a mushroom-like shape or cone with a pointing tip. When the electrode is a protrusion, the end portion of the conductive part 5 is preferably made to have a planar end surface, such as prism or column. When the end surface is a plane, as in the latter case, the end portion of the conductive part 5 may be at the even level with the surface of the insulating layer 1b.

The conductive part 3 has a conductive layer 34 for improving connection to the conductive circuit 2, and a ball conductor 33 to be connected to the external substrate B.

The material of the conductor layer 34 may be any as long as it has conductivity, and is exemplified by the same kinds of metals exemplified for the conductive part or various alloys containing same as components. Particularly preferred is gold which has high connection reliability.

While the thickness of the conductive layer is not particularly limited, it is suitably about 0.01–10 μm to improve connection of the ball to the conductive circuit.

The material of the ball is exemplified by the same kinds of metals exemplified for the conductive part and various alloys containing same as components. Particularly preferred is solder which has superior shape modification performance and connection reliability.

The size of the ball is not particularly limited and may be determined as appropriate according to, for example, the size of the lead of the external substrate B. Generally, its diameter is suitably about 30–500 μm.

The shape of the ball may be other than the shape shown in FIG. 6, such as mushroom and cone, like the end portion of the conductive part 5 mentioned above.

The ball may be formed on the through-hole 32 when manufacturing the film carrier A, or formed immediately before connecting the film carrier A to the external substrate B.

The exposed part (4 in FIG. 6) of the conductive circuit, which is defined by the insulating layer 1a, is the part from which an energy for making a connection to the semiconductor element is introduced.

In FIG. 6, a through-hole 42 is formed in the insulating layer 1a opposite from the conductive part 5 (conductive path 51) to be connected to the semiconductor element C, and the conductive circuit is exposed at the bottom of the through-hole 42.

The shape of the through-hole 42 need only correspond to the energy supply jig, and is exemplified by circle, square and polygon, with preference given to circle.

The area of the exposed part 4 of the conductive circuit (area of the opening of through-hole 42 which forms exposed part 4 in FIG. 6) is 50–200%, preferably 70–150%, more preferably 80–130%, of the area of the conductive part 5 to be connected to the semiconductor element C (area of opening of through-hole 52 which forms conductive path 51 in FIG. 6). When the area of the exposed part 4 is not more than 200% of the area of the conductive part 5, release of the heat to be the energy to make a connection to a semiconductor element, or dispersion of the ultrasonic oscillation, which phenomena being caused by too large an area of the exposed part 4, occurs less. Moreover, easy recognition of the position of conductive part 5 leads to less occurrence of connection failure. When the area is not less than 50%, absorption of the ultrasonic oscillation by insulating layer 1a due to the contact of the energy supply jig with the insulating layer 1a is less.

The conductive circuit exposed at the bottom of the through-hole 42 may be plated with gold, platinum, palladium, ruthenium and the like on the surface thereof for the prevention of oxidation.

Figure 8:
FIG. 8 is a schematic cross section of one embodiment of the fabrication of the film carrier of the present invention.
Figure 8:
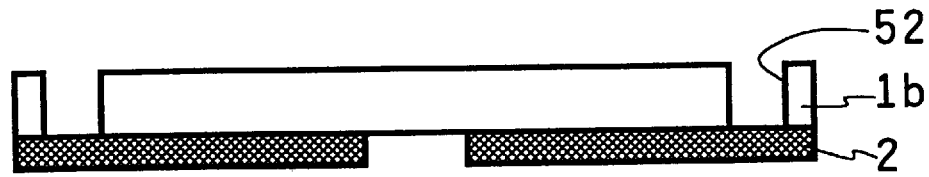
Figure 8:
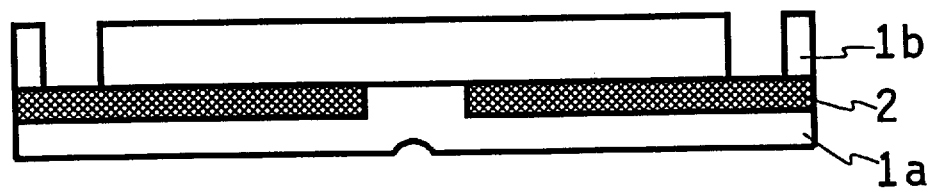
Figure 8:
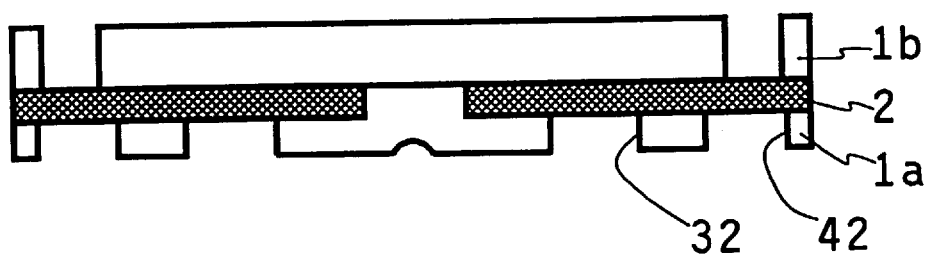
Figure 8:
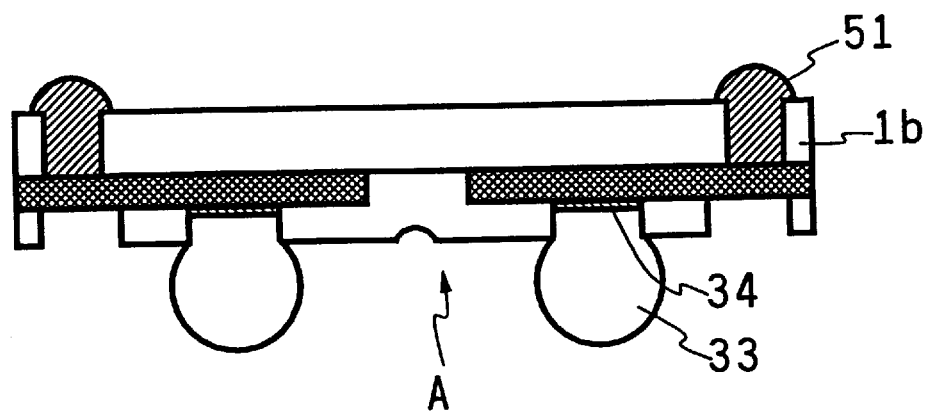

The above-mentioned film carrier A can be prepared by, for example, the method shown in FIG. 8. The fabrication of the film carrier A is explained in the following in the order of the steps shown in FIG. 8.

(1) As shown in FIG. 8(a), a conductive circuit 2 is laminated on one surface of the insulating layer 1b.
(2) As shown in FIG. 8(b), a through-hole 52 is formed in the insulating layer 1b to expose the conductive circuit at the bottom of the through-hole 52. The diameter of the through-hole 52 is about 5–200 μm, preferably about 8–100 μm.
(3) As shown in FIG. 8(c), an insulating layer 1a is laminated on the surface of the conductive circuit, which has not been covered with the insulating layer. The insulating layer 1a can be formed by, for example, heat compression, extrusion forming, cast coating and the like.
(4) As shown in FIG. 8(d), through-holes 32 and 42 are formed in the insulating layer 1a to expose the conductive circuit at the bottom of the through-holes 32 and 42. The through-holes 32 and 42 can be formed by the same method as used for forming the above-mentioned through-hole 52. The diameter of the through hole 32 is suitable about 50–400 μm.

(5) As shown in FIG. 8(*e*), a conductive substance is filled in the through-hole 52 to form a conductive part, and a conductive layer 34 is formed in the through-hole 32, whereby a film carrier A is completed.

In the fabrication of the film carrier A, the through-hole 52 may be formed after forming the insulating layer 1*a*, or through-holes 32 and 42 may be formed after forming the conductive path 51. The fabrication steps may be subject to partial modification besides these.

Figure 9:
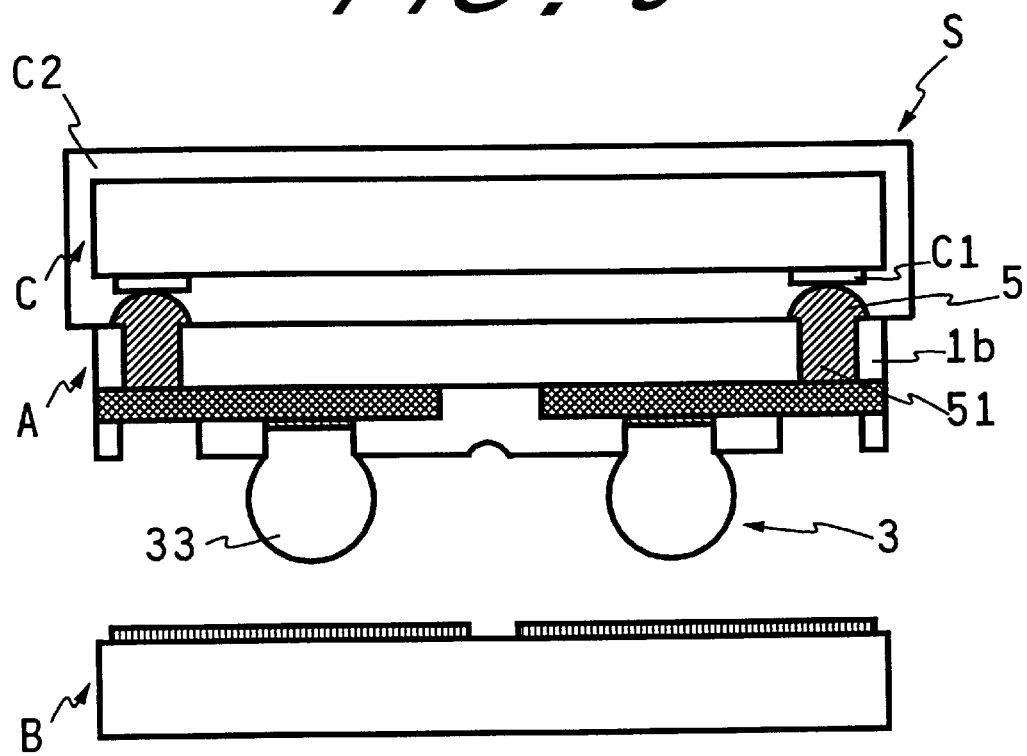
FIG. 9 is a schematic cross section of another embodiment of the semiconductor device of the present invention.

FIG. 9 is a schematic cross section of one embodiment of the semiconductor device of the present invention. In this figure, electrode C1 of semiconductor element C is connected to the conductive part 5 (conductive path 51) to be connected to the semiconductor element C of the film carrier A of the present invention, which is the same as the one shown in FIG. 1, and the semiconductor element C is mounted on the film carrier A.

In FIG. 9, the semiconductor element C mounted on the film carrier A is covered with an insulating resin layer C2, and this insulating resin layer contacts the insulating layer 1*b* of the film carrier A.

In the semiconductor device S shown in FIG. 9, moreover, a conductive part 3 to be connected to the external substrate B is formed inside the region where the semiconductor element C is mounted. Accordingly, the size (area) of the semiconductor device S is about the same as the size (area) of the semiconductor element C.

By connecting the ball 33 of the semiconductor device S to the landing portion of the external substrate B, the semiconductor element C and the external substrate B are conducted in the direction of the thickness of the film carrier A.

Figure 10:
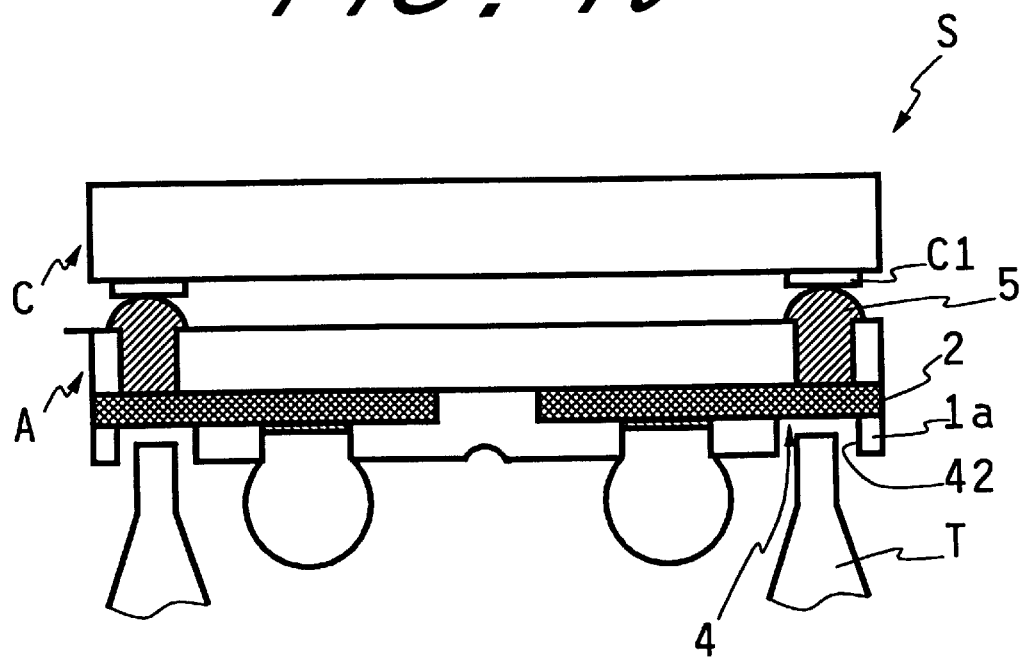
FIG. 10 is a schematic cross section of another embodiment of the method of the present invention for mounting a semiconductor element.

FIG. 10 is a schematic cross section of one embodiment of the method for mounting a semiconductor element C on the film carrier A. In this figure, electrode C1 of semiconductor element C is connected to the conductive part 5 of the film carrier A of the present invention, which is the same as the one shown in FIG. 1, an energy supply jig T is inserted into the through-hole 42, the energy supply jig T is placed in contact with the exposed part 4 of the conductive circuit, and the energy for connecting semiconductor element is supplied form said energy supply jig T to connect the conductive part 5 to the electrode C1, whereby a semiconductor device S, which is the same as the one shown in FIG. 4, is obtained.

EXAMPLE 1

The fabrication steps of the film carrier of FIG. 1 and the fabrication steps of a semiconductor device using said film carrier are given in the following.

(Preparation of film carrier)

A 25 μm thick polyimide resin layer was formed on a 18 μm thick copper foil, and the copper foil was processed to give a circuit pattern by etching, whereby a laminate of an insulating layer and a conductive circuit was obtained. This conductive circuit was plated with gold (thickness 1μm) by electrolytic plating. Then, the conductive part in the insulating layer, which was to be connected to the external substrate, and the part where an energy introduction part was to be formed were subjected to laser processing to give through-holes having a diameter of 60 μm. Said through-holes were filled with copper by electrolytic plating using the conductive circuit as an electrode, and subjected to gold plating (thickness 1 μm) to prevent oxidation of the copper, whereby to give a conductive path to be connected to an external substrate and an energy introduction part to connect a semiconductor element. These conductive path and energy introduction part protruded 10 μm from the insulator surface in a mushroom shape. A ball-shaped portion having a diameter of about 120 μm was formed, using a solder, on the upper end of the conductive path to be connected to the external substrate, whereby a film carrier which was the same as the one shown in FIG. 1 was obtained.

(Mounting of semiconductor element)

The electrode of the semiconductor element was brought into contact with the conductive circuit of the above-mentioned film carrier, and a bonding tool was placed in the energy introduction part of said film carrier to supply ultrasonic wave energy. While supplying the energy, the conductive circuit and the electrode of the semiconductor element were adhered by compression to give a semiconductor device which was the same as the one shown in FIG. 4.

EXAMPLE 2

The fabrication steps of the film carrier of FIG. 2 and the fabrication steps of a semiconductor device using said film carrier are shown in the following.

(Preparation of film carrier)

In the same manner as in Example 1 except that copper was not filled in the through-holes, and the conductive path to be connected to the external substrate and the energy introduction part were not formed to have a protrusion shape, a film carrier was prepared.

(Mounting of semiconductor element)

The electrode of a semiconductor element was brought into contact with the conductive circuit of the above-mentioned film carrier, and a bonding tool was placed in the energy introduction part of said film carrier. While supplying heat and ultrasonic wave energy to the conductive circuit exposed at the bottom of the through-hole, the conductive circuit and the electrode of the semiconductor element were adhered by compression to give a semiconductor device.

The semiconductor devices obtained in Examples 1 and 2 had approximately the same size with the semiconductor element. In these semiconductor devices, the continuity of the conductive circuit of the film carrier and the electrode of the semiconductor element was tested to find it in good condition.

EXAMPLE 3

The fabrication steps of the film carrier of FIG. 6 and the fabrication steps of a semiconductor device using said film carrier are shown in the following.

(Preparation of film carrier)

(1) As shown in FIG. 8(*a*), a 25 μm thick polyimide resin layer was formed on a 18 μm thick copper foil, and the copper foil was processed to give a circuit pattern by etching, whereby a laminate of a first insulating layer 5*b* and a conductive circuit was obtained.

(2) As shown in FIG. 8(*b*), a through-hole 52 having a diameter of 60 μm was formed in the first insulating layer 1*b* by photo-abrasion with eximer laser beam at the position where a conductive part to be connected to the semiconductor element was to be formed.

(3) As shown in FIG. 8(*c*), a 10 μm thick polyimide resin layer was adhered, by thermal compression, to the surface of the conductive circuit, which had not been covered with an insulating layer, to laminate a second insulating layer 1*a*.

(4) As shown in FIG. 8(d), through-holes 32 and 42 (diameter 100 μm and 75 μm, respectively) were formed in the second insulating layer 1a at the position where a conductive part for making a connection to an external substrate was to be formed, and the position from where the energy for making a connection to the semiconductor element was to be supplied, so that the conductive circuit was exposed at the bottom of the through-holes 32 and 42.

(5) As shown in FIG. 8(e), electrolytic plating was applied using the above-mentioned conductive circuit as an electrode to fill gold in the through-hole 52 in the first insulating layer 1b, as well as the through-hole 32 where a conductive part to be connected to the external substrate was to be formed in the second insulating layer 1a, whereby a conductive part 5 and a 1 μm thick conductive layer 34 were formed, respectively. The conductive part 5 protruded 15 μm in a mushroom shape from the surface of the first insulating layer 1b, and a solder ball 33 having a diameter of about 150 μm was formed on the conductive layer 34, whereby a film carrier A which was the same as the one shown in FIG. 1 was obtained.

(Mounting of semiconductor element)

As shown in FIG. 10, the electrode C1 of the semiconductor element C was brought into contact with the conductive part 5 of the above-mentioned film carrier A, and an energy supply jig T was inserted in the through-hole 42 in the second insulating layer 1a to place the energy supply jig T in the exposed part 4 of the conductive circuit. Ultrasonic wave oscillation was applied from the energy supply jig T to connect said conductive part 5 to the electrode C1 of the semiconductor element C, whereby a semiconductor device S which was the same as the one shown in FIG. 9 was obtained.

As has been described in detail, the present invention has enabled provision of fine-pitched or highly dense wiring of a semiconductor element, and assures easy and dependable electric connection of a film carrier to a semiconductor element.

The construction of the present invention wherein an energy for connection is supplied form the energy introduction part to make a connection of a film carrier to a semiconductor element is advantageous in that attenuation of the energy for connection due to an insulating layer occurs less, since the energy for connection can be directly introduced into conductive circuit, thus enabling efficient utilization of the energy, which in turn permits easy and efficient mounting of a semiconductor element.

What is claimed is:

1. A film carrier comprising a laminate which comprises
a first insulating layer,
a conductive circuit laminated to one side of said first insulating layer,
a conductive part on the other side of said first insulating layer, connected to said conductive circuit and adapted to be connected to an external substrate,
and an energy introduction part on said other side of said first insulating layer, adapted to supply energy for connecting a semiconductor element to the conductive circuit to a connecting point,
wherein said first insulating layer is flexible, is a resin selected from the group consisting of a thermosetting resin and a thermoplastic resin and has a thickness of 2–500 μm,
wherein the film carrier is capable of being mounted on a semiconductor element with said conductive circuit forming a connection to an electrode of the semiconductor element to mount the semiconductor element, and
wherein said energy introduction part is adapted to supply an energy selected from the group consisting of heat, pressure, and ultrasonic wave energy to a connecting point on said conductive circuit to form a connection between said conductive circuit and the electrode of the semiconductor element.

2. The film carrier of claim 1, wherein the conductive circuit is adapted to be connected directly to a semiconductor element.

3. The film carrier of claim 1, wherein said conductive part is adapted to be connected to an external substrate comprises a conductive path penetrating said first insulating layer in the thickness direction of the layer.

4. The film carrier of claim 3, wherein the energy introduction part comprises a conductive path penetrating said first insulating layer in the thickness direction of the layer.

5. The film carrier of claim 1, wherein said first insulating layer comprises a hole penetrating said first insulating layer in the thickness direction of the layer and said energy introduction part comprises a conductive circuit exposed at the bottom of said hole penetrating said first insulating layer in the thickness direction of the layer.

6. The film carrier of claim 1, wherein the laminate comprises a region adapted to mount a semiconductor and where said conductor part adapted to be connected to an external substrate is formed inside said region adapted to mount a semiconductor.

7. The film carrier of claim 1, wherein the energy to make a connection to the semiconductor element is selected form the group consisting of heat, pressure, ultrasonic wave and combinations thereof.

8. A semiconductor device comprising a semiconductor element mounted on the film carrier of claim 1.

9. A method for mounting a semiconductor element on the film carrier of claim 1, comprising contacting an electrode of a semiconductor element with the conductive circuit of the film carrier and applying an energy selected from the group consisting of heat, pressure, and ultrasonic wave energy to the energy introduction part to form a connection between the conductive circuit and the electrode of the semiconductor element.

10. The film carrier of claim 1, further comprising a second insulating layer laminated on the conductive circuit, and a conductive part formed on said second insulating layer to make a connection to the semiconductor element, wherein the conductive part is connected the conductive circuit through said second insulating layer, so that the semiconductor element to be mounted is connected to the conductive circuit through said conductive part.

11. A method for mounting a semiconductor element on the film carrier of claim 10, comprising contacting an electrode of a semiconductor element with the conductive part of the film carrier and applying an energy selected from the group consisting of heat, pressure, and ultrasonic wave energy to the energy introduction part to form a connection between the conductive part and the electrode of the semiconductor element.

12. The film carrier of claim 10, wherein the conductive part to make a connection to the semiconductor element has a conductive path penetrating the second insulating layer in the thickness direction of the layer.

13. The film carrier of claim 12, wherein the amount of conductive circuit exposed through said hole penetrating said second insulating layer is an area corresponding to 50–200% of the area of the conductive part adapted for making a connection to a semiconductor element.

14. The film carrier of claim 10, wherein said first insulating layer has a through-hole penetrating said first insulating layer in the direction of layer thickness, and the energy introduction part is the conductive circuit exposed at the inside bottom of the through-hole.

15. The film carrier of claim 1, wherein said energy introduction part comprises a conductive path penetrating said first insulating layer in the thickness of the layer.

* * * * *